US011222698B2

(12) United States Patent
You et al.

(10) Patent No.: US 11,222,698 B2
(45) Date of Patent: Jan. 11, 2022

(54) MICROCONTROLLER, MEMORY SYSTEM HAVING THE SAME, AND METHOD FOR OPERATING THE SAME

(71) Applicant: SK hynix Inc., Gyeonggi-do (KR)

(72) Inventors: Byoung Sung You, Seoul (KR); Seung Hyun Chung, Gyeonggi-do (KR); Jae Young Lee, Incheon (KR)

(73) Assignee: SK hynix Inc., Gyeonggi-do (KR)

( * ) Notice: Subject to any disclaimer, the term of this patent is extended or adjusted under 35 U.S.C. 154(b) by 23 days.

(21) Appl. No.: 16/802,141

(22) Filed: Feb. 26, 2020

(65) Prior Publication Data

US 2020/0194074 A1  Jun. 18, 2020

Related U.S. Application Data

(62) Division of application No. 15/962,582, filed on Apr. 25, 2018, now Pat. No. 10,614,885.

(30) Foreign Application Priority Data

Sep. 12, 2017  (KR) .......................... 10-2017-0116713

(51) Int. Cl.
| | |
|---|---|
| *G11C 29/00* | (2006.01) |
| *G11C 16/10* | (2006.01) |
| *G06F 12/16* | (2006.01) |
| *G11C 16/32* | (2006.01) |
| *G11C 16/22* | (2006.01) |
| *G11C 29/32* | (2006.01) |

(52) U.S. Cl.
CPC .............. *G11C 16/10* (2013.01); *G06F 12/16* (2013.01); *G11C 16/225* (2013.01); *G11C 16/32* (2013.01); *G11C 29/00* (2013.01); *G11C 29/32* (2013.01)

(58) Field of Classification Search
CPC ........................... G06F 13/1008; H03M 13/00
See application file for complete search history.

(56) References Cited

U.S. PATENT DOCUMENTS

| | | | |
|---|---|---|---|
| 5,742,758 A | 4/1998 | Dunham et al. | |
| 6,237,116 B1 * | 5/2001 | Fazel ................. | G06F 11/1052 714/720 |
| 7,134,063 B2 * | 11/2006 | Cho ...................... | G11C 29/14 714/733 |
| 7,475,314 B2 * | 1/2009 | Chhabra ................ | G11C 29/10 714/718 |
| 7,802,155 B2 * | 9/2010 | Hiew ..................... | G11C 29/56 714/718 |
| 9,558,012 B2 * | 1/2017 | Chudgar ............... | G06F 9/4408 |
| 2002/0133773 A1 * | 9/2002 | Richter ................. | G01R 31/318533 714/733 |

(Continued)

OTHER PUBLICATIONS

Office Action issued by the Taiwan Intellectual Property Office dated Aug. 26, 2021.

*Primary Examiner* — Esaw T Abraham
(74) *Attorney, Agent, or Firm* — IP & T Group LLP

(57) ABSTRACT

There are provided a microcontroller, a memory system having the same, and a method for operating the same. A memory system includes: a semiconductor memory performing a scanning operation on ROM data stored in a microcontroller in a test operation and outputting a result of the scanning operation as a status output signal; and a controller for determining whether an error exists in the ROM data, using the status output signal.

9 Claims, 8 Drawing Sheets

(56) References Cited

U.S. PATENT DOCUMENTS

| | | | |
|---|---|---|---|
| 2004/0006730 A1* | 1/2004 | Cho | G11C 29/14 |
| | | | 714/733 |
| 2007/0101214 A1* | 5/2007 | Stauffer | G01R 31/2884 |
| | | | 714/724 |
| 2007/0234138 A1* | 10/2007 | Torisaki | G11C 7/24 |
| | | | 714/710 |
| 2008/0052573 A1* | 2/2008 | Pekny | G01R 31/31701 |
| | | | 714/724 |
| 2012/0166901 A1* | 6/2012 | Kim | G01R 31/318555 |
| | | | 714/726 |
| 2013/0332629 A1* | 12/2013 | Okabe | G06F 13/102 |
| | | | 710/8 |

* cited by examiner

MICROCONTROLLER, MEMORY SYSTEM HAVING THE SAME, AND METHOD FOR OPERATING THE SAME

CROSS-REFERENCE TO RELATED APPLICATION

This application is a division of U.S. patent application Ser. No. 15/962,582 filed on Apr. 25, 2018 which is now U.S. Pat. No. 10,614,885 issued on Apr. 7, 2020, and claims the benefits of priority of Korean Patent Application No. 10-2017-0116713 filed on Sep. 12, 2017. The disclosure of each of the foregoing applications is incorporated herein by reference in its entirety.

BACKGROUND

1. Field of Invention

Various exemplary embodiments of the present disclosure generally relate to an electronic device. Particularly, the embodiments relate to a microcontroller, a memory system including the microcontroller, and a method for operating the same.

2. Description of the Related Art

The computer environment paradigm has recently been transitioning to ubiquitous computing, which enables computing systems to be used anywhere and anytime. As a result, use of portable electronic devices such as mobile phones, digital cameras, laptop computers, and the like has rapidly increased. These portable electronic devices generally include a memory system having one or more memory devices, i.e., data storage devices, for storing data. The data storage device may be used as a main memory device or an auxiliary memory device of the portable electronic devices.

The memory systems provide excellent stability and durability, high information access speed, and low power consumption, since there is no mechanical driving part. Examples of memory systems having such advantages include includes a universal serial bus (USB) memory device, memory cards having various interfaces, a solid state drive (SSD), and the like.

SUMMARY

Embodiments provide a microcontroller, a memory system having the same, and a method for operating the same, which can improve the reliability of the memory system by detecting an error of ROM data stored in the microcontroller.

According to an aspect of the present disclosure, there is provided a memory system including: a semiconductor memory device performing a scanning operation on ROM data stored in a microcontroller in a test operation and outputting a result of the scanning operation as a status output signal; and a controller configured to determine whether an error exists in the ROM data, using the status output signal.

According to an aspect of the present disclosure, there is provided a microcontroller including: a control logic configured to store ROM data and output control signals for controlling an internal circuit in response to a command input from the outside; a ROM data divider configured to divide and store the ROM data with a set data size in a test operation, and sequentially output the stored divided data; a ROM data scanner configured to output a ROM data scanning signal by performing a scanning operation on the data output from the ROM data divider; and an output circuit configured to output the ROM data scanning signal.

According to an aspect of the present disclosure, there is provided a method for operating a microcontroller, the method including: reading ROM data stored in a ROM in response to a test mode enable signal; dividing the read ROM data according to a set data size; detecting an error by sequentially scanning the divided ROM data; and outputting a result of the detecting of the error as a status output signal.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described. As those skilled in the art will realize, the described embodiments may be modified in various ways, without departing from the spirit or scope of the present disclosure. Accordingly, the drawings and description are to be regarded as illustrative and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
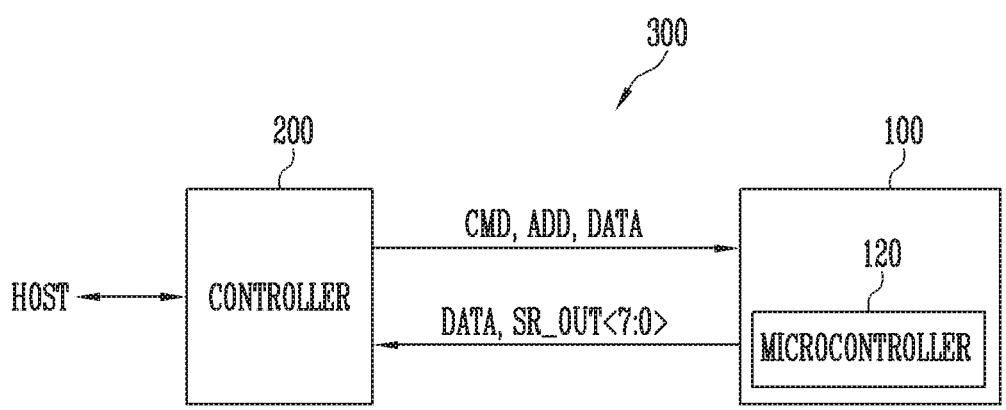
FIG. 1 is a block diagram illustrating a memory system according to an embodiment of the present disclosure.

FIG. 1 is a block diagram illustrating a memory system 300 according to an embodiment of the present disclosure.

Referring to FIG. 1, the memory system 300 may include a semiconductor memory device 100 and a controller 200 for controlling an operation of the semiconductor memory device 100 in response to a request from a host.

The semiconductor memory device 100 may perform a program operation on memory cells of pages included in a memory block in response to a command CMD, an address signal ADD, and data DATA, which are received from the controller 200, or perform a read operation on a memory block in response to a command and an address signal, which are received from the controller 200.

The semiconductor memory device 100 may include a microcontroller 120. The microcontroller 120 may store read-only memory (ROM) data corresponding to algorithms of a program operation, a read operation, and an erase operation. The microcontroller 120 may also control a peripheral circuit of the semiconductor memory device 100 to perform the program operation, the read operation, or the erase operation on memory cells included in a memory block according to a command CMD input from the controller 200 and the stored ROM data.

Also, in a test operation, the microcontroller 120 according to the embodiment of the present disclosure may read ROM data stored therein, check whether a data error exists in the read ROM data to detect the data error using a cyclic redundancy check (CRC) method, and output a result of the check as a status output signal SR_OUT<7:0>.

The controller 200 may check whether an error exists in the ROM data stored in the microcontroller 120 of the semiconductor memory device 100 according to the status output signal SR_OUT<7:0> received to the semiconductor memory device 100, and determine whether to use the semiconductor memory device 100 or not based on a result of the determination.

Figure 2:
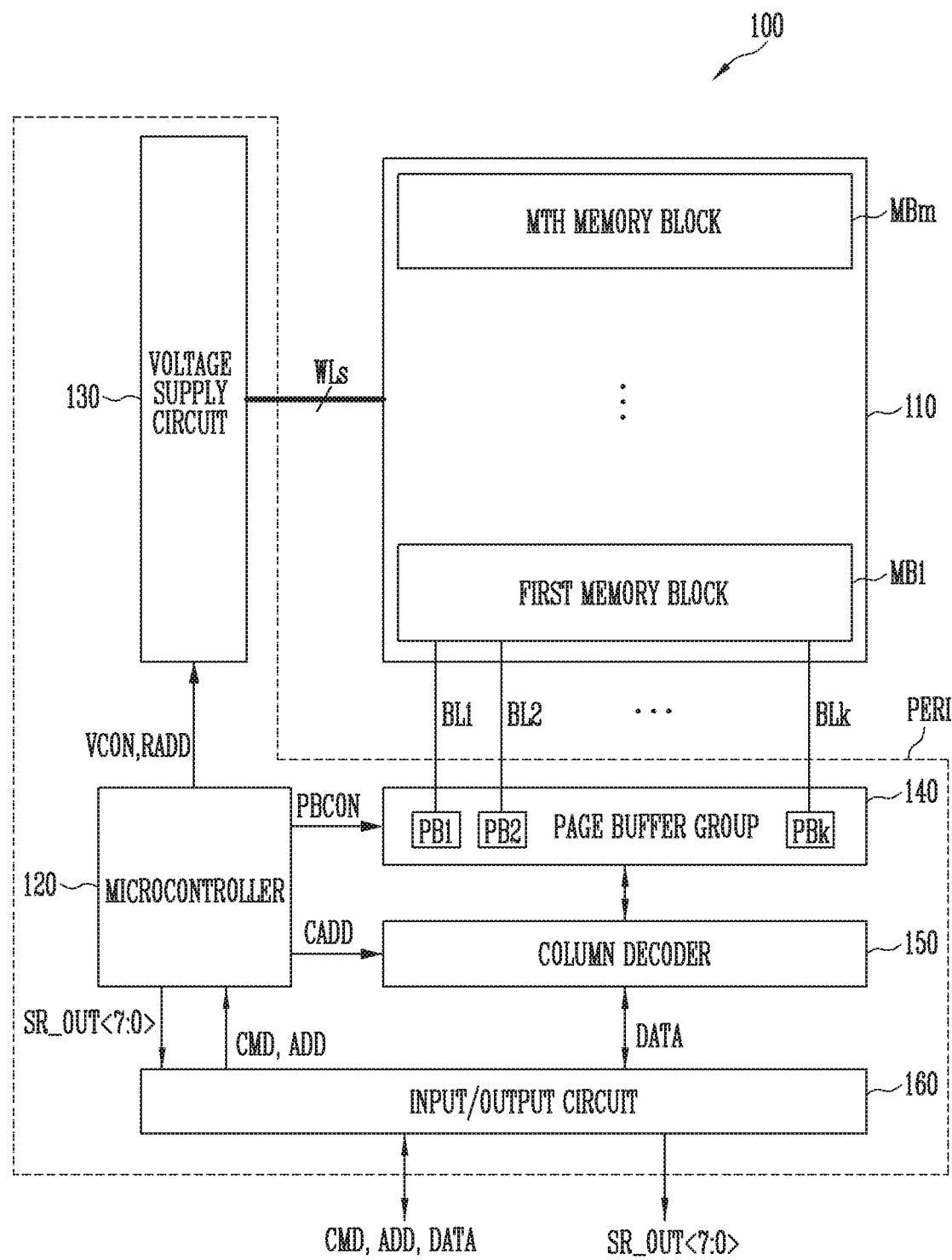
FIG. 2 is a block diagram illustrating a semiconductor memory device shown in FIG. 1.

FIG. 2 is a block diagram illustrating the semiconductor memory device 100 shown in FIG. 1.

Referring to FIG. 2, the semiconductor memory device 100 according to the embodiment of the present disclosure may include a memory cell array 110 including first to mth memory blocks MB1 to MBm and a peripheral circuit PERT configured to perform a program operation and a read operation on memory cells included in a selected page of the memory blocks MB1 to MBm. The peripheral circuit PERI may include a microcontroller 120, a voltage supply circuit 130, a page buffer group 140, a column decoder 150, and an input/output circuit 160. Although FIG. 2 illustrates that the microcontroller 120 is included in the peripheral circuit PERI, the present disclosure is not limited thereto. That is, the microcontroller 120 may not be included in the peripheral circuit PERI, and may be configured to control the peripheral circuit PERT.

The microcontroller 120 outputs a voltage control signal VCON for generating a voltage required to perform a program operation, a read operation, or an erase operation in response to a command CMD input externally through the input/output circuit 160, and outputs a PB control signal PBCON for controlling page buffers PB1 to PBk included in the page buffer group 140, depending on the type of an operation. Also, the microcontroller 120 outputs a row address signal RADD and a column address signal CADD in response to an address signal ADD input from the outside through the input/output circuit 160.

Also, in a test operation, the microcontroller 120 reads ROM data stored therein, checks whether an error exists in the read ROM data to detect the error, and outputs the result of the check as an output signal SR_OUT<7:0>.

The voltage supply circuit 130 supplies operating voltages required to perform a program operation, a read operation, and an erase operation on memory cells in response to the voltage control signal VCON of the microcontroller 120 to local lines WLs including a drain select line, word lines, and a source select line of a selected memory block. The voltage supply circuit 130 may include a voltage generating circuit and a row decoder.

The voltage generating circuit of the voltage supply circuit 130 outputs operating voltages required to perform a program operation, a read operation, or an erase operation of memory cells to global lines in response to the voltage control signal VCON of the microcontroller 120.

The row decoder of the voltage supply circuit 130 connects the global lines to the local lines WLs such that the operating voltages output to the global lines by the voltage generating circuit can be transferred to the local lines WLs of a selected memory block in the memory cell array 110.

The page buffer group 140 may include a plurality of page buffers PB1 to PBk coupled to the memory cell array 110 through bit lines BL1 to BLk, respectively. The page buffers PB1 to PBk of the page buffer group 140 may selectively precharge the bit lines BL1 to BLk according to input data to store data in the memory cells in response to the PB control signal PBCON of the microcontroller 120, or may sense voltages of the bit lines BL1 to BLk so as to read data from the memory cells.

The column decoder 150 selects the page buffers PB1 to PBk included in the page buffer group 140 in response to the column address signal CADD output from the microcontroller 120. That is, the column decoder 150 sequentially transfers data to be stored in the memory cells to the page buffers PB1 to PBk in response to the column address signal CADD. In addition, the column decoder 740 sequentially selects the page buffers PB1 to PBk in response to the column address signal CADD such that data of the memory cells, which are latched to the page buffers PB1 to PBk in a read operation can be output to the outside.

The input/output circuit 160 transfers data to the column decoder 150 under the control of the microcontroller 120 to input, to the page buffer group 140, data DATA input externally to be stored in the memory cells in a program operation. When the column decoder 150 transfers the data DATA transferred from the input/output circuit 160 to the page buffers PB1 to PBk of the page buffer group 140, the page buffers PB1 to PBk may store the input data in latch circuits thereof. In a read operation, the input/output circuit 160 outputs data DATA transferred from the page buffers PB1 to PBk of the page buffer group 140 through the column decoder 150.

Furthermore, the input/output circuit 160 outputs, to the controller 200 of FIG. 1, the status output signal SR_OUT<7:0> output from the microcontroller 120 in the test operation.

Figure 3:
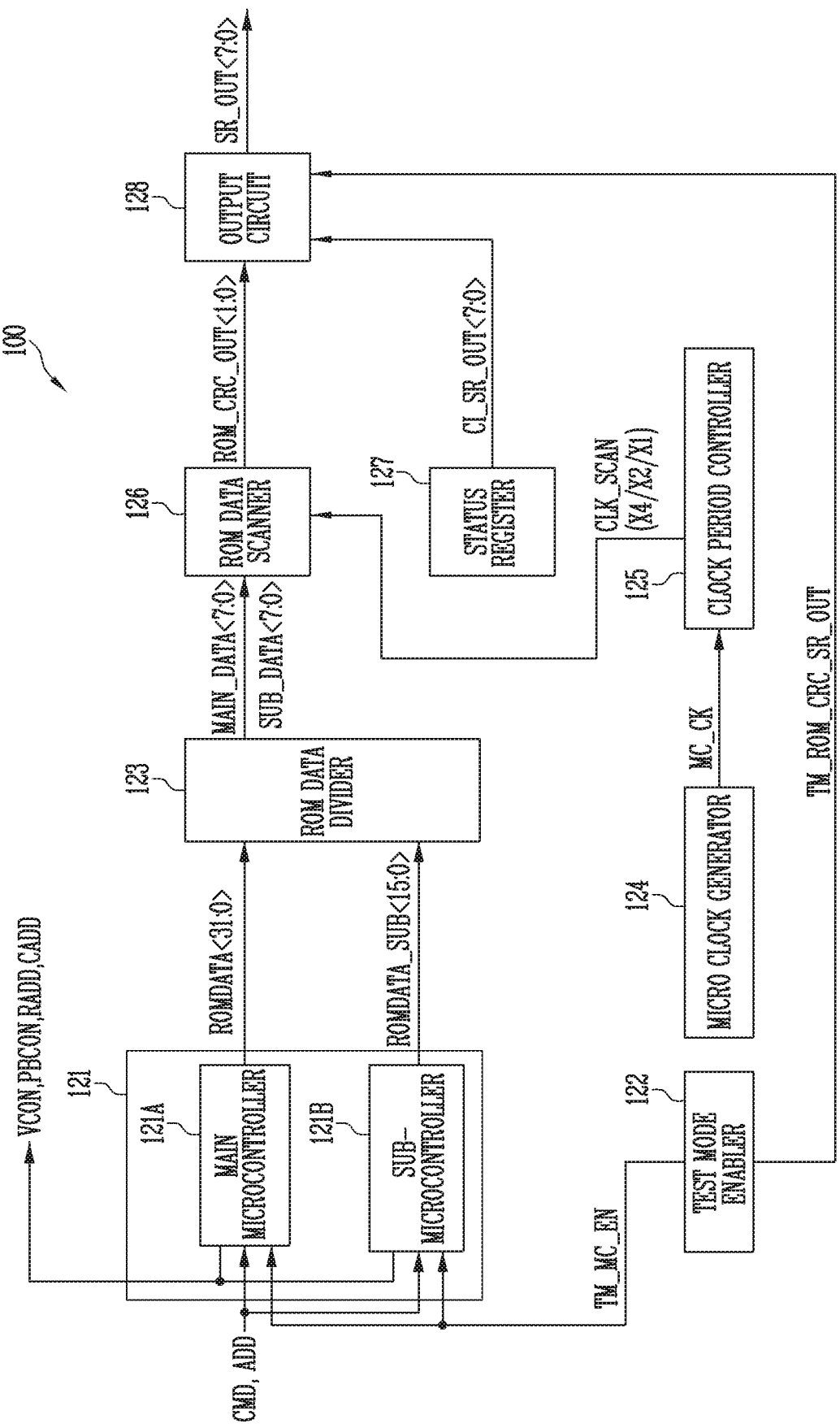
FIG. 3 is a block diagram illustrating a microcontroller shown in FIG. 2.

FIG. 3 is a block diagram illustrating the microcontroller 120 shown in FIG. 2.

Referring to FIG. 3, the microcontroller 120 may include a control logic 121, a test mode enabler 122, a ROM data divider 123, a micro clock generator 124, a clock period controller 125, a ROM data scanner 126, a status register 127, and an output circuit 128.

The control logic 121 may include at least one control circuit. In the embodiment of the present disclosure, a case where the control logic 121 includes two control circuits, i.e., a main microcontroller 121A and a sub-microcontroller 121B, will be described.

The main microcontroller 121A outputs a voltage control signal VCON and a PB control signal PBCON, which are used to control the peripheral circuit PERI of FIG. 2, e.g., the voltage supply circuit 130 and the page buffer group 140, to perform an operation corresponding to a command CMD input thereto, and outputs a row address signal RADD and a column address signal CADD in response to an address signal ADD.

When a new command CMD is input during the operation of the main microcontroller 121A, the sub-microcontroller 121B may output a voltage control signal VCON and a PB control signal PBCON such that an operation corresponding to the new command CMD is performed.

In addition, the control logic 121 reads and output ROM data ROMDATA<31:0> and sub-ROM data ROMDATA_SUB<15:0>, which are respectively stored in the main microcontroller 121A and the sub-microcontroller 121B, in a test operation of the microcontroller 120.

In the test operation of the microcontroller 120, the test mode enabler 122 generates and outputs a test enable signal TM_MC_EN, and outputs a test mode scanning output signal TM_ROM_CRC_SR_OUT for controlling a status output signal SR_OUT<7:0> to be output based on a result of the test operation.

The test mode enabler 122 according to the embodiment of the present disclosure may be enabled after a power-on reset operation, after a microcontroller reset operation, or when the host requests the test operation.

In the test operation of the microcontroller 120, the ROM data divider 123 receives ROM data ROMDATA<31:0> and sub-ROM data ROMDATA_SUB<15:0>, which are respectively stored in the main microcontroller 121A and the sub-microcontroller 121B of the control logic 121, and outputs main data MAIN_DATA<7:0> and sub-data SUB_DATA<7:0> by dividing the ROM data ROMDATA<31:0> and the sub-ROM data ROMDATA_SUB<15:0> according to a set data division size. The ROM data divider 123 may sequentially output the main data MAIN_DATA<7:0> and the sub-data SUB_DATA<7:0>.

The micro clock generator 124 generates and outputs a micro clock MC_CK having a certain period in an operation of the semiconductor memory device, and the clock period controller 125 generates and outputs a scan clock CLK_SCAN by selecting one clock period among a plurality of clock periods X4, X2, and X1, using the micro clock MC_CK, according to the data division size set by the ROM data divider 123. For example, the clock period controller 125 may generate and output the scan clock CLK_SCAN having a shorter clock period as the set data division size becomes larger. The clock period controller 125 may generate and output the scan clock CLK_SCAN having a longer clock period as the set data division size becomes smaller.

The ROM data scanner 126 performs an error detection operation on a plurality of data groups by performing a scanning operation, in response to the scan clock CLK_SCAN, on the main data MAIN_DATA<7:0> and the sub-data SUB_DATA<7:0>, which are sequentially transmitted from the ROM data divider 123. Through the error detection operation, the ROM data scanner 126 checks whether a data error exists in the plurality of data groups to detect the data error, using the CRC method, and outputs the result of the check as a ROM data scanning signal ROM_CRC_OUT<1:0>. A CRC may be performed using, for example, a CRC32 code. For example, when any error is not included in the main data MAIN_DATA<7:0> or the sub-data SUB_DATA<7:0>, a first ROM data scanning signal ROM_CRC_SR<0> may be output. When an error is included in the main data MAIN_DATA<7:0> or the sub-data SUB_DATA<7:0>, a second ROM data scanning signal ROM_CRC_SR<1> may be output.

The status register 127 stores a result of a status check operation of the semiconductor memory device 100, and outputs the result as an internal status output signal CI_SR_OUT<7:0>.

The output circuit 128 may poll the ROM data scanning signal ROM_CRC_OUT<1:0> in the internal status output signal CI_SR_OUT<7:0> in response to the test mode scanning output signal TM_ROM_CRC_SR_OUT in a ROM data test operation of the microcontroller 120, and output the polled signal as the status output signal SR_OUT<7:0>.

Figure 4:
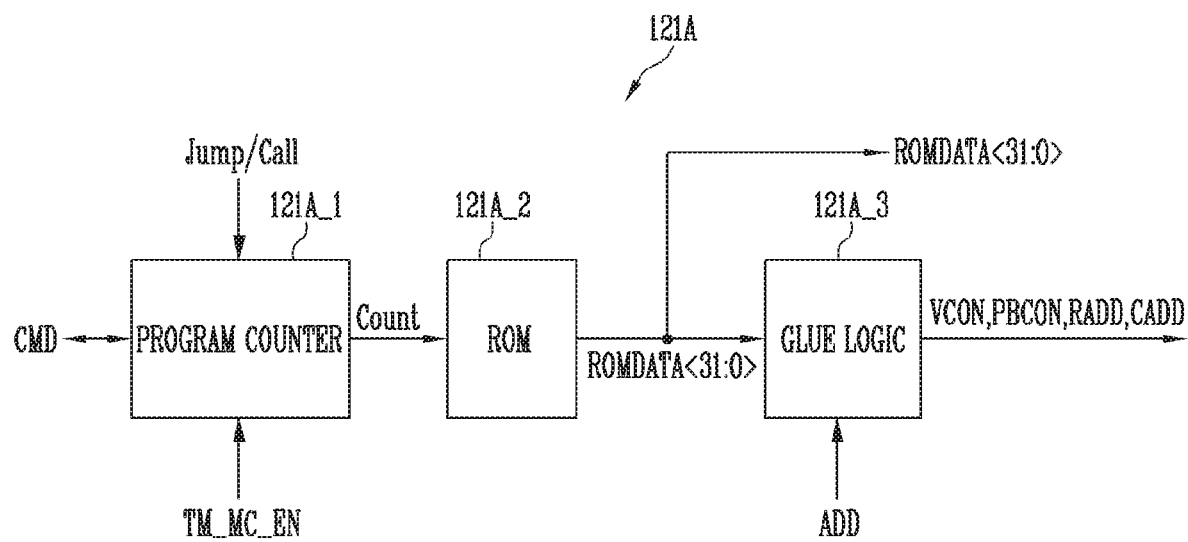
FIG. 4 is a block diagram illustrating a main microcontroller shown in FIG. 3.

FIG. 4 is a block diagram illustrating the main microcontroller 121A shown in FIG. 3.

Structures and operations of the main microcontroller 121A and the sub-microcontroller 121B of FIG. 3 according to the embodiment of the present disclosure are similar to each other. Therefore, the main microcontroller 121A will be representatively described for convenience of description, and overlapping descriptions will be omitted herein.

Referring to FIG. 4, the main microcontroller 121A may include a program counter 121A_1, a ROM 121A_2, and a glue logic 121A_3.

The program counter 121A_1 outputs a counting signal Count that is incremented by a predetermined number in response to a command CMD and a jump/call signal Jump/Call in a program operation, a read operation, or an erase operation of the semiconductor memory device, and outputs a counting signal Count that is incremented by 1 in response to a test enable signal TM_MC_EN in a test operation of the microcontroller 120.

The ROM 121A_2 stores a plurality of ROM data corresponding to algorithms of the program operation, the read operation, and the erase operation of the semiconductor memory device, and outputs the plurality of stored ROM data ROMDATA<31:0> in response to the counting signal Count. Also, the ROM 121A_2 outputs the plurality of stored ROM data ROMDATA<31:0> in response to the counting signal Count that is incremented by 1 in the test operation of the microcontroller 120. At this time, the ROM 121A_2 may read all ROM data ROMDATA<31:0> corresponding to addresses from the start address to the last address in response to the counting signal Count that is incremented by 1 and sequentially output the read ROM data.

The glue logic 121A_3 may output a voltage control signal VCON and a PB control signal PBCON in response to the ROM data ROMDATA<31:0> output from the ROM 121A_2 in the program operation, the read operation, or the erase operation of the semiconductor memory device, and output a row address signal RADD and a column address signal CADD in response to an address signal ADD.

Figure 5:
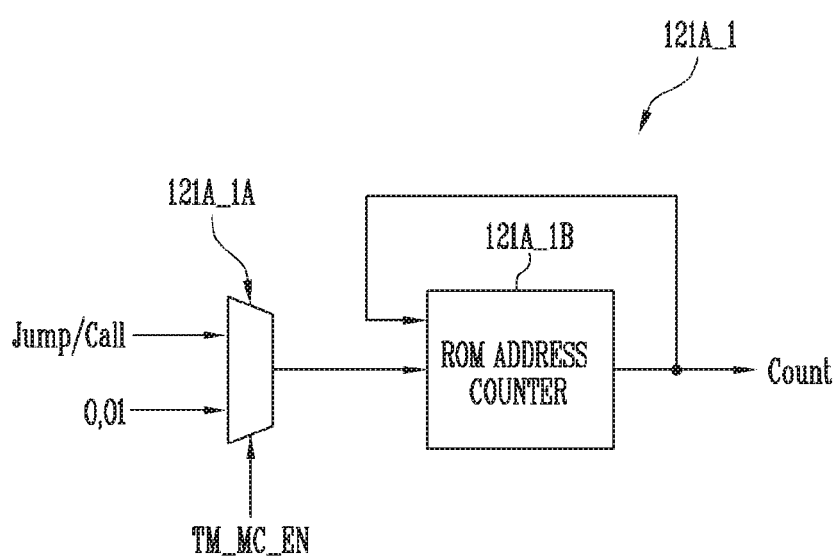
FIG. 5 is a block diagram illustrating a program counter of FIG. 4.

FIG. 5 is a block diagram illustrating the program counter 121A_1 of FIG. 4.

Referring to FIG. 5, the program counter 121A_1 may include a selection circuit 121A_1A and a ROM address counter 121A_1B.

The selection circuit 121A_1A may select and output, in response to a test enable signal TM_MC_EN, a test signal 0.01 corresponding to the first counting value (e.g., 0) and the last counting value (e.g., 01) or a jump/call signal Jump/Call for calling a counting value corresponding to an algorithm corresponding to a command. For example, the selection circuit 121A_1A may select and output the jump/call signal Jump/Call in the program operation, the read operation, or the erase operation of the semiconductor memory device, and select and output the test signal 0,01 in the test operation of the semiconductor memory device.

The ROM address counter 121A_1B outputs a counting signal Count in response to the signal output from the selection circuit 121A_B. For example, the ROM address counter 121A_1B outputs a counting signal that is sequentially incremented from a specific counting value in response to the jump/call signal Jump/Call in the program operation, the read operation, or the erase operation of the semiconductor memory device. At this time, the specific counting value is changed depending on the program operation, the read operation, or the erase operation of the semiconductor memory device. The ROM address counter 121A_1B outputs a counting signal Count that is incremented by 1 from 0 in response to the test operation of the semiconductor memory device.

The ROM address counter 121A_1B receives the current counting signal Count and increments the counting signal Count by 1 to output a new counting signal Count.

Figure 6:
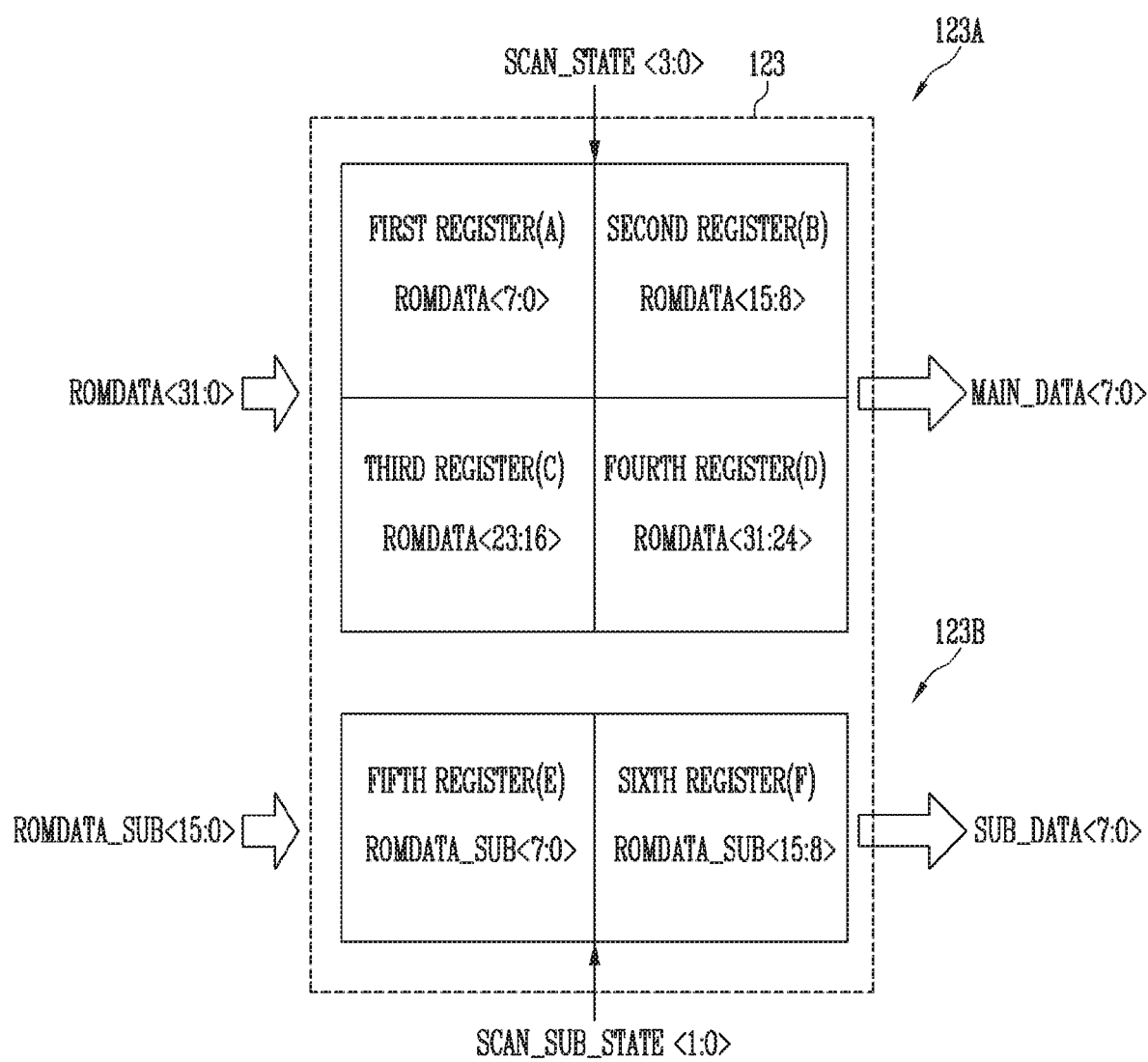
FIG. 6 is a configuration diagram illustrating a ROM data divider shown in FIG. 3.

FIG. 6 is a configuration diagram illustrating the ROM data divider 123 shown in FIG. 3.

Referring to FIG. 6, the ROM data divider 123 may include a main ROM data divider 123A and a sub-ROM data divider 123B.

The main ROM data divider 123A may include a plurality of registers, e.g., first to fourth registers A to D. The first to fourth registers A to D may divide a plurality of ROM data ROMDATA<31:0> output from the main microcontroller 121A into data groups with a set data size and store the respective divided data groups. For example, in an embodiment of the present disclosure, a first data group ROMDATA<7:0> may be stored in the first register A, a second data group ROMDATA<15:8> may be stored in the second register B, a third data group ROMDATA<23:16> may be stored in the third register C, and a fourth data group ROMDATA<31:24> may be stored in the fourth register D. The first to fourth registers A to D output ROM data respectively stored therein as main data MAIN_DATA<7:0> in response to a scan sate signal SCAN_STATE<3:0>. In this case, the first to fourth registers A to D sequentially perform a data output operation.

The sub-ROM data divider 123B may include a plurality of registers, e.g., fifth and sixth registers E and F. The fifth and sixth registers E and F may divide a plurality of ROM data ROMDATA_SUB<15:0> output from the sub-microcontroller 121A into data groups with a set data size and store the respective divided data groups. For example, in an embodiment of the present disclosure, a first sub-data group ROMDATA_SUB<7:0> may be stored in the fifth register E, and a second sub-data group ROMDATA_SUB<15:8> may be stored in the sixth register F.

The fifth and sixth registers E and F output ROM data respectively stored therein as sub-data SUB_DATA<7:0> in response to a sub-scan sate signal SCAN_STATE_SUB<1:0>. In this case, the fifth and sixth registers E and F sequentially perform the data output operation.

The main ROM data divider 123A and the sub-ROM data divider 123B divide and store ROM data and sub-ROM data, based on the same data size.

Also, in the test operation of the microcontroller, the main ROM data divider 123A and the sub-ROM data divider 123B may be sequentially selected to perform the data output operation.

Figure 7:
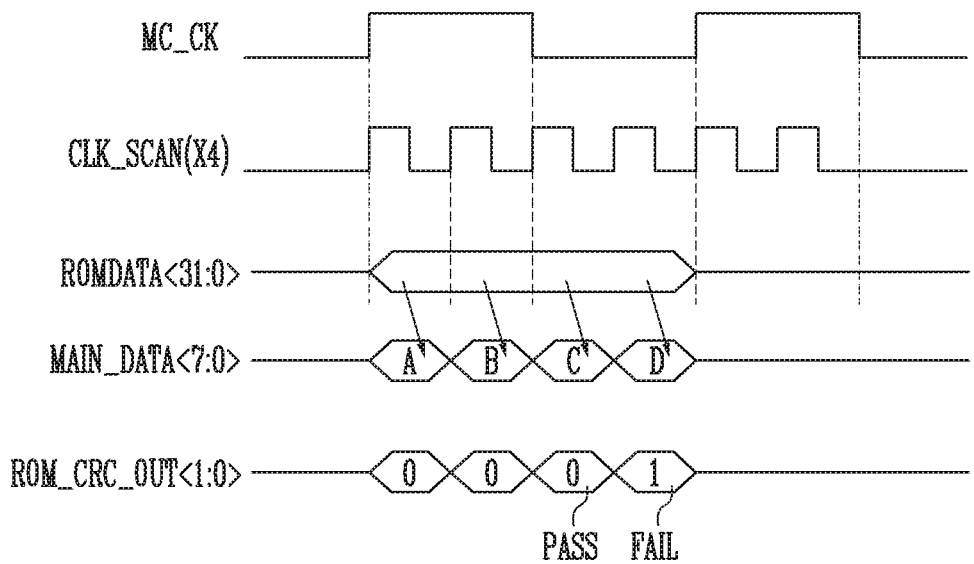
FIG. 7 is a waveform diagram of signals, illustrating a test operation of the microcontroller according to an embodiment of the present disclosure.

FIG. 7 is a waveform diagram of signals, illustrating a test operation of the microcontroller 120 according to an embodiment of the present disclosure.

Figure 8:
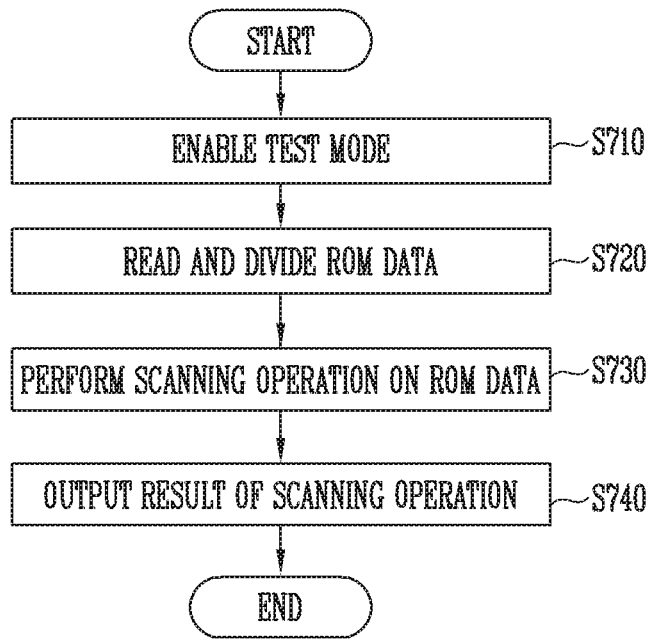
FIG. 8 is a flowchart illustrating the test operation of the microcontroller according to an embodiment of the present disclosure.

FIG. 8 is a flowchart illustrating the test operation of the microcontroller 120 according to an embodiment of the present disclosure.

The test operation of the microcontroller 120 according to the embodiment of the present disclosure will be described as follows with reference to FIGS. 1 to 8.

In a power-on reset operation, in a reset operation of the microcontroller 120, or when a test operation is requested from the host, the test mode enabler 122 is enabled to generate and output a test enable signal TM_MC_EN at step S710.

The control logic 121 of the microcontroller 120 reads and outputs ROM data ROMDATA<31:0> and sub-ROM data ROMDATA_SUB<15:0>, which are respectively stored in the main microcontroller 121A and the sub-microcontroller 121B, in the test operation of the microcontroller 120 at step S720. At this time, the main microcontroller 121A and the sub-microcontroller 121B respectively read and output all ROM data ROMDATA<31:0> and all sub-ROM data ROMDATA_SUB<15:0>, which correspond to addresses from the start address to the last address, in response to a counting signal Count that is incremented by 1.

The ROM data divider 123 divides and store the ROM data ROMDATA<31:0> and the sub-ROM data ROMDATA_SUB<15:0>, which are output from the control logic 121, with a set data size, and outputs the divided and stored ROM data and sub-ROM data as main data MAIN_DATA<7:0> or sub-data SUB_DATA<7:0> in response to a scan state signal SCAN_STATE<3:0> or a sub-scan state signal SCAN_STATE_SUB<1:0> at step S730.

The ROM data scanner 126 performs an error detection operation on a plurality of data groups by performing a scanning operation on the main data MAIN_DATA<7:0> and the sub-data SUB_DATA<7:0>, which are sequentially transmitted from the ROM data divider 123, in response to a scan clock CLK_SCAN. The error detection operation checks whether a data error exists in the plurality of data groups to detect the data error, using the CRC method, and outputs the result of the check as a ROM data scanning signal ROM_CRC_OUT<1:0>. A CRC may be performed using, for example, a CRC32 code. For example, when any error is not included in the main data MAIN_DATA<7:0> and the sub-data SUB_DATA<7:0>, a first ROM data scanning signal ROM_CRC_SR<0> may be output at step S740. When an error is included in the main data MAIN_DATA<7:0> and the sub-data SUB_DATA<7:0>, a second ROM data scanning signal ROM_CRC_SR<1> may be output at step S740.

The output circuit 128 The output circuit 128 may poll the ROM data scanning signal ROM_CRC_OUT<1:0> in an internal status output signal CI_SR_OUT<7:0> in response to a test mode scanning output signal TM_ROM_CRC_SR_OUT, and output the polled signal as a status output signal SR_OUT<7:0>. The status output signal SR_OUT<7:0> is transmitted to the controller 200 through the input/output circuit 160, and the controller 200 may determine whether an error exists in the ROM data and the sub-ROM data, which are stored in the microcontroller 120, based on the status output signal SR_OUT<7:0>.

According to the above-described embodiment of the present disclosure, ROM data stored in a ROM of the microcontroller is read, and an error in the read ROM data is detected through a scanning operation, so that the reliability of the microcontroller and a memory system having the same can be improved.

Figure 9:
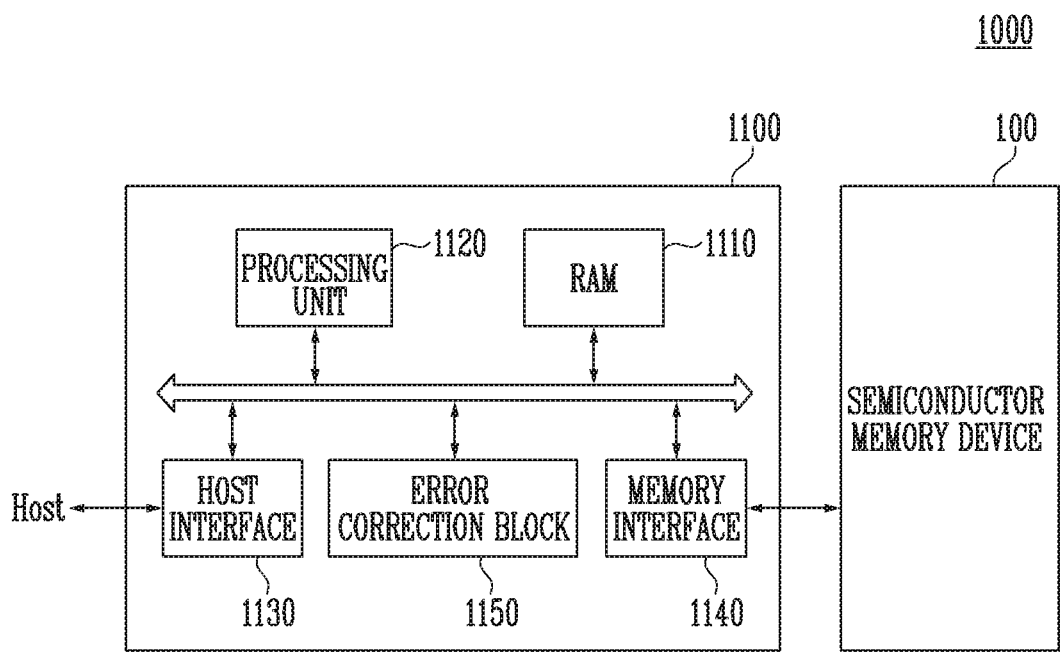
FIG. 9 is a block diagram illustrating another embodiment of the memory system.

FIG. 9 is a block diagram illustrating an embodiment of the memory system 1000.

Referring to FIG. 9, the memory system 1000 includes a semiconductor memory device 100 and the controller 1100.

The semiconductor memory device 100 may be configured and operated identically to the semiconductor memory device described with reference to FIG. 1. Accordingly, the semiconductor memory device 100 is configured to include a microcontroller. In a test operation, the microcontroller may read ROM data stored in a ROM of the microcontroller and detect an error in the read ROM data. Hereinafter, overlapping descriptions will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 110 is used as at least one of a working memory of the processing unit 1120, a cache memory between the semiconductor memory device 100 and the host Host, and a buffer memory between the semiconductor memory device 100 and the host Host.

The host interface 1130 includes a protocol for exchanging data between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processing unit 1120 may control the semiconductor memory device 100 to adjust a read voltage, based on an error detection result of the error correction block 1150, and to perform re-reading. In an exemplary embodiment, the error correction block 1150 may be provided as a component of the controller 1100.

The controller 1100 and the semiconductor memory device 100 may be integrated into one semiconductor memory device. In an exemplary embodiment, the controller 1100 and the semiconductor memory device 100 may be integrated into one semiconductor memory device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCO), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 10:
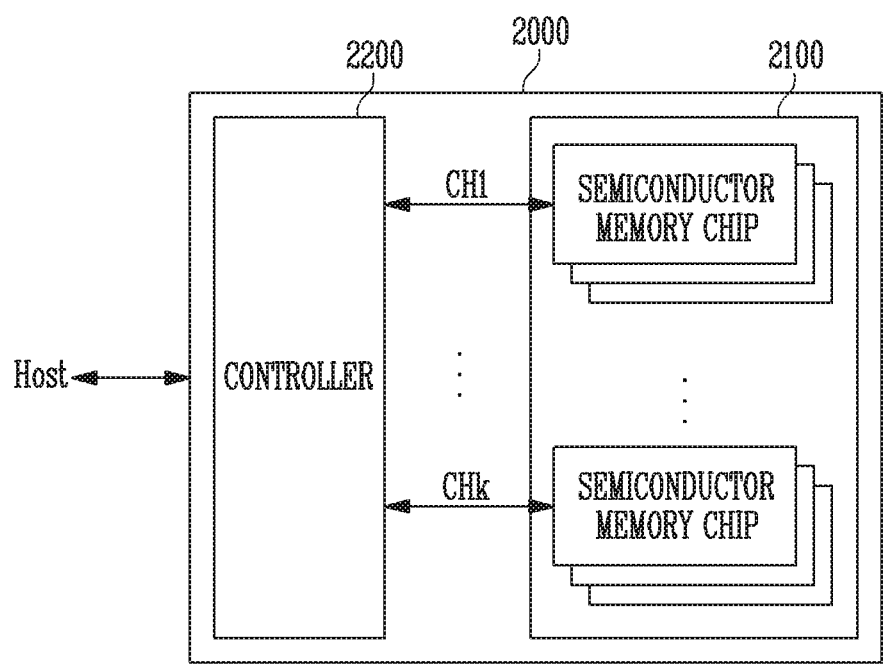
FIG. 10 is a block diagram illustrating an application example of the memory system of FIG. 9.

FIG. 10 is a block diagram illustrating an application example of the memory system 1000 of FIG. 9.

Referring to FIG. 10, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 10, it is illustrated that the plurality of groups communicate with the controller 2200 through first to kth channels CH1 to CHk. Each semiconductor memory chip may be configured and operated identically to the semiconductor memory device 100 described with reference to FIG.

Each group is configured to communicate with the controller 2200 through one common channel. The controller 2200 is configured similarly to the controller 1100 described with reference to FIG. 9. The controller 2200 is configured to control the plurality of memory chips of the semiconductor memory device 2100 through the plurality of channels CH1 to CHk.

Figure 11:
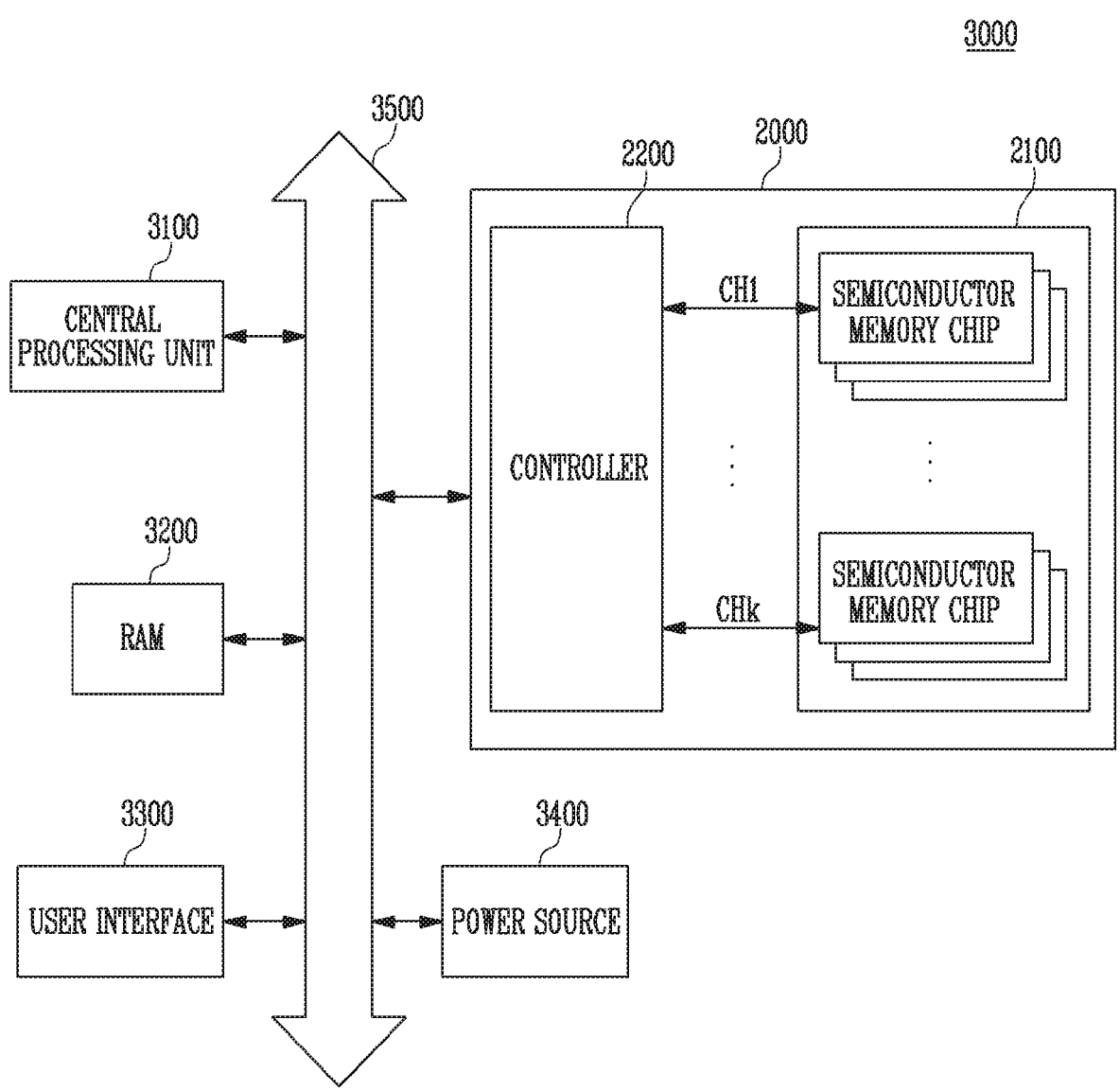
FIG. 11 is a block diagram illustrating a computing system including the memory system described with reference to FIG. 10.

FIG. 11 is a block diagram illustrating a computing system 300 including the memory system described with reference to FIG. 10.

Referring to FIG. 11, the computing system 300 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 11, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 11, it is illustrated that the memory system 2000 described with reference to FIG. 10 is provided. However, the memory system 2000 may be replaced by the memory system 1000 described with reference to FIG. 9. In an exemplary embodiment, the computing system 3000 may be configured to include both the memory systems 1000 and 2000 described with reference to FIGS. 9 and 10.

According to the present disclosure, ROM data stored in the ROM of the microcontroller is read, and an error in the read ROM data is detected through a scanning operation, so that it is possible to improve the reliability of the microcontroller and the memory system having the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
a semiconductor memory device performing a scanning operation on ROM data stored in a microcontroller in a test operation and outputting a result of the scanning operation as a status output signal; and
a controller configured to determine whether an error exists in the ROM data, using the status output signal, wherein the microcontroller includes:
a ROM data divider configured to divide and store the ROM data with a set data size, and sequentially output the stored divided data as main data and sub-data.

2. The memory system of claim 1, wherein the scanning operation checks whether an error exists in the ROM data to detect the error, using a cyclic redundancy check (CRC) method.

3. The memory system of claim 1, wherein the microcontroller further includes:
a control logic configured to store the ROM data, output control signals for controlling a peripheral circuit in response to a command input from the outside, and read and output the ROM data in response to a test mode enable signal in the test operation;
a ROM data scanner configured to output a ROM data scanning signal by performing the scanning operation on the main data or the sub-data in response to a scan clock; and
an output circuit configured to poll the ROM data scanning signal in an internal status output signal and output the polled signal as the status output signal.

4. The memory system of claim 3, wherein the microcontroller further includes:
a test mode enabler configured to generate the test mode enable signal for enabling a test mode after a power-on reset operation, after a reset operation of the microcontroller, or when the test operation is requested from a host; and
a clock period controller configured to generate the scan clock by controlling a micro clock with a set period.

5. The memory system of claim 3, wherein the control logic includes a main microcontroller and a sub-microcontroller.

6. The memory system of claim 5, wherein the ROM data divider includes:
a main ROM data divider configured to receive the ROM data stored in the main microcontroller in the test operation, and divide and store the received ROM data according to a set data division size; and
a sub-ROM data divider configured to receive sub-ROM data stored in the sub-microcontroller in the test operation, and divide and store the received sub-ROM data according to the set data division size.

7. The memory system of claim 6, wherein the main ROM data divider includes a plurality of registers,
wherein the ROM data respectively divided and stored in the plurality of registers are sequentially selected in response to a scan state signal and are output as the main data.

8. The memory system of claim 6, wherein the sub-ROM data divider includes a plurality of registers,
wherein the sub-ROM data respectively divided and stored in the plurality of registers are sequentially selected in response to a scan state signal and are output as the sub-data.

9. The memory system of claim 3, wherein the ROM data scanner performs the scanning operation, using a CRC32 code.

* * * * *